United States Patent
Guerrero

(10) Patent No.: US 6,450,250 B2
(45) Date of Patent: *Sep. 17, 2002

(54) STACKABLE HEAT SINK FOR ELECTRONIC COMPONENTS

(75) Inventor: Fred Guerrero, Oxnard, CA (US)

(73) Assignee: PSC Computer Products, Inc., Oxnard, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/366,153

(22) Filed: Aug. 3, 1999

Related U.S. Application Data

(63) Continuation-in-part of application No. 09/330,946, filed on Jun. 11, 1999, now Pat. No. 6,199,625.

(51) Int. Cl.[7] .................................................. H05K 7/00
(52) U.S. Cl. .............................. 165/104.33; 165/80.3; 361/700
(58) Field of Search ................................ 165/80.3, 185, 165/104.33, 182; 361/700

(56) References Cited

U.S. PATENT DOCUMENTS

| | | | | |
|---|---|---|---|---|
| 1,805,116 A | * | 5/1931 | Trane | 165/182 |
| 1,854,278 A | * | 4/1932 | Smith | 165/182 |
| 1,893,270 A | * | 1/1933 | Caldwell | 165/182 |
| 3,457,988 A | | 7/1969 | Meyerhoff et al. | |
| 3,687,194 A | * | 8/1972 | Scholl | 165/180 |
| 3,865,184 A | * | 2/1975 | Grover | 165/133 |
| 4,340,902 A | | 7/1982 | Honda et al. | |
| 5,175,612 A | | 12/1992 | Long et al. | |
| 5,351,166 A | | 9/1994 | Kang | |
| 5,396,947 A | * | 3/1995 | Itoh | 165/104.14 |
| 5,412,535 A | * | 5/1995 | Chao et al. | 361/700 |
| 5,574,626 A | | 11/1996 | Smith | |
| 5,600,540 A | | 2/1997 | Blomquist | |
| 5,654,587 A | | 8/1997 | Schneider et al. | |
| 5,699,227 A | * | 12/1997 | Kolman et al. | 361/700 |
| 5,773,886 A | | 6/1998 | Rostoker et al. | |
| 5,794,684 A | | 8/1998 | Jacoby | |

FOREIGN PATENT DOCUMENTS

| | | | | |
|---|---|---|---|---|
| JP | 57-65524 | * | 4/1982 | 165/104.33 |

OTHER PUBLICATIONS

*Webster's Ninth New Collegiate Dictionary*, 1984, 560, Merriam–Webster, Inc., Springfield.

* cited by examiner

*Primary Examiner*—Allen Flanigan
(74) *Attorney, Agent, or Firm*—Andrea L. Mays

(57) ABSTRACT

A stackable heat sink having a core shaft in heat-engaging relation with a semiconductor device and a plurality of individual thin fins having an opening for receiving the core shaft in press fit relation so that a plurality of the fins, when mounted on the shaft, define a plurality of air passageways and the fins and shaft efficiently transfer heat away from the semiconductor device and into the surrounding atmosphere. In an improved version of the heat sink, the heat-dissipating fins may be corrugated so as to increase the surface area of each individual fin without increasing its perimeter. A heat pipe may be used in conjunction with the core shaft or base of the heat sink so as to facilitate heat transfer away from the electronic component. An improved heat sink may also include a base having a plurality of openings and a small fan connected to the portion of the base with the openings, so as to direct air across and between adjacent fins.

10 Claims, 9 Drawing Sheets

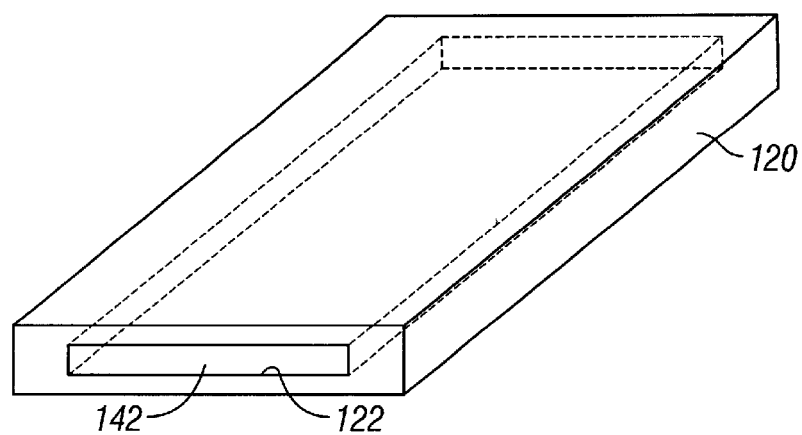
FIG. 19
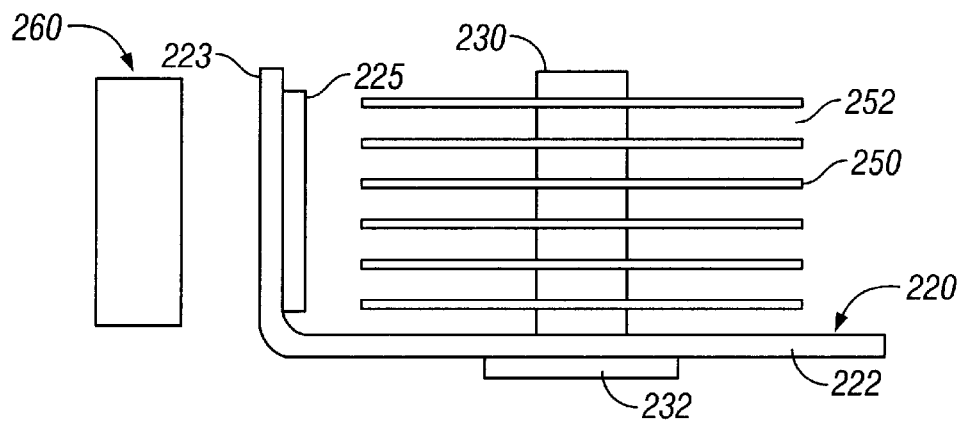
FIG. 20
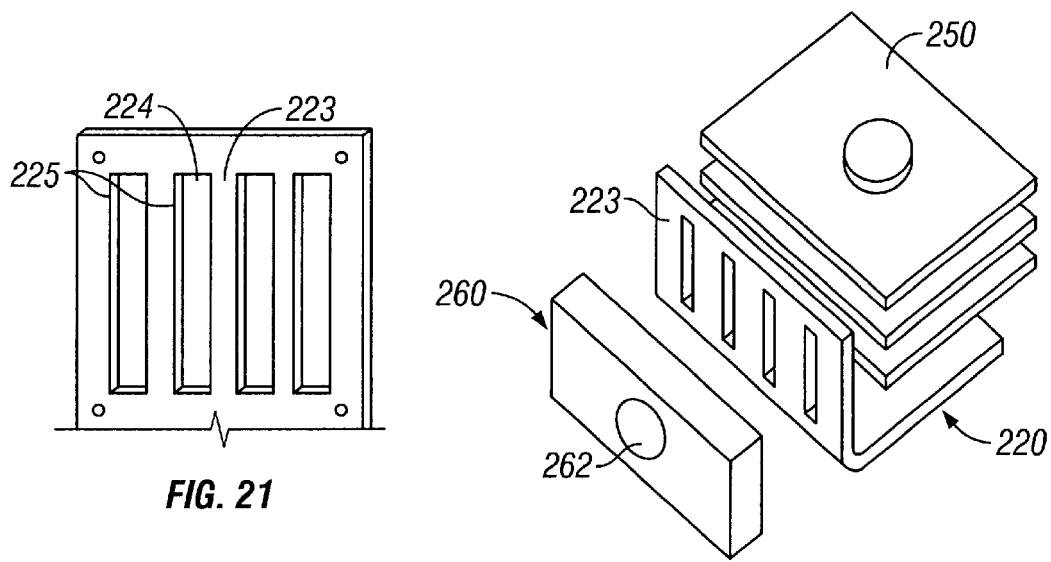
FIG. 21
FIG. 22

STACKABLE HEAT SINK FOR ELECTRONIC COMPONENTS

RELATED APPLICATIONS

This application is a continuation-in-part application of U.S. patent application Ser. No. 09/330,946, entitled "Stackable Heat Sink for Electronic Components", filed on Jun. 11, 1999, now U.S. Pat. No. 6,199,625 and the specification thereof is incorporated herein by reference.

FIELD OF THE INVENTION

This invention relates to cooling of electronic components and assemblies through the provision of a heat sink.

BACKGROUND OF THE INVENTION

Integrated circuits or other electronic components are generally mounted on printed circuit boards which are then installed in an enclosure for the electronic equipment. A personal computer would be a typical electronic device that houses printed circuit boards having such electronic components. There has been since the advent of the integrated circuit a steady progression of larger and larger devices capable of performing more functions within a single component package. At the same time, there has been a trend toward the packing of a larger number of components onto a printed circuit board and within a given volume of an enclosure. The result of these two trends and others, has resulted in an increasing requirement for low-cost, efficient, heat-dissipating devices for use within the electronic equipment.

One type of heat-dissipating device is a simple fan mounted within the enclosure and designed to circulate air through the enclosure, removing the hot air and introducing cooler air so as to dissipate the heat generated by the electronic components. Another method of removing heat is the use of a heat sink. The term "heat sink" is here used in its normal dictionary definition: "a substance or device for the absorption or dissipation of unwanted heat (as from a process or an electronic device)." Webster's Ninth New Collegiate Dictionary, p. 560 (1983). A typical heat sink used in the electronics industry for dissipating heat from components will comprise a base and a plurality of fins. The heat sink base is secured in firm heat-transfer engagement with the electronic component so as to absorb the heat from the component, passing it into the plurality of fins, which in turn radiate the heat into the surrounding air. Heat sinks are normally constructed from high heat-conducting material, such as metal, including aluminum and copper. Heat sinks may be used in combination with a fan.

A typical heat sink may be formed from an aluminum extrusion in which the base and fins are integral. The extrusion is then cut off in sections, each section forming an individual heat sink. Since the extrusion process results in fins that are in parallel planes, the fins form a plurality of passages between the fins extending in one direction. When a heat sink is formed with passages in one direction, it is desirable to have the fan and heat sink located relative to one another so that the air flow of the fan is parallel with the air passages between the fins. That is of course not always possible or desirable for other reasons. It has therefore been common to machine passages in a perpendicular direction to the extruded air passages, resulting in a series of spike-like fins, as shown in U.S. Pat. No. 5,600,540. In that manner, the positioning of the heat sink relative to the fan offers greater design flexibility.

One of the shortcomings in the heat sinks described above is that they have a fixed heat-dissipating area for a given size determined by the height of the extruded fins. In many electronic assemblies, the electronic components are mounted on the printed circuit board in close relation to one another. Therefore, mounting a heat sink on a particular electronic device is more or less circumscribed by the area (width and length) of the electronic component. Generally speaking, the space in which the heat sink may be mounted is unrestricted as to height as opposed to the area of the component. However, since the height of the fins is predetermined by the extrusion, it is not possible to change the heat-dissipating area of a particular extruded heat sink without infringing upon the air space of adjacent components. The thermal designer for the electronic assembly is therefore faced with specifying a custom-made extruded heat sink of a particular height for a particular application, or attempting to accommodate the limited heat sink dissipation capability by selection of a more powerful fan. Thus, a heat sink with a fixed heat-dissipating area presents the thermal designer with a design restriction that is undesirable.

A related problem with the extruded heat sink is that even after the designer selects a heat sink of a given surface area and therefore heat-dissipating capacity, the use of the component in a particular printed circuit board configuration and in a specific electronic enclosure may change the thermal conditions in which the component and its associated extruded heat sink will be used, requiring redesign of the extruded heat sink or again resorting to removal of heat through a more powerful fan. Even after the manufacturing stage is reached, thermal testing may show that the theoretical calculations did not properly accommodate the heat generated and still further modifications to the heat sink dissipation surface area or fan must be designed.

In short, the thermal designer of electronic equipment is continually faced throughout the design and manufacturing process with the limitation of the surface area of an extruded heat sink because the size of the base is restricted by the crowded "real estate" on the printed circuit board and the height of the extruded heat sink is predetermined. Of course, heat sinks may be made with fins of different height, but that requires stocking of heat sinks of different heights to accommodate changes during the design process that results in different thermal conditions. It also complicates the inventory stocking of heat sinks in manufacturing as well as in customer service.

It is therefore a primary object of the present invention to provide a heat sink in which the heat-dissipating capacity may be varied at any point during design, manufacturing or use.

Another object of this invention is to provide a heat sink in which a plurality of fins may be manually added so as to increase the heat-dissipating surface capacity.

One other object of the present invention is to provide a construction whereby the heat is rapidly and efficiently dispersed to the fins where the heat is dissipated.

Still another object of the present invention is to provide a heat sink in which the air passages are in a plane parallel to the plane of the printed circuit board on which the electronic component is mounted and to which the heat sink is attached so as to accommodate air flow in any direction.

All of the objects of the invention may be accomplished through the provision of a stackable heat sink that includes a plurality of fins which are mounted generally parallel to the electronic component and printed circuit board on a core shaft one end of which is in heat conducting relation with the electronic component, and a base with an opening for receiving the core shaft.

In an improved stackable heat sink, the problem of the limited area available for the fins may be partially solved without increasing the perimeter of the fin by forming a corrugated, rather than a flat, fin. One of the limitations in a stackable heat sink is the ability of the core shaft to transfer heat from one end in contact with the heat source to the other end and thus to the individual fins. It is an object of this invention to promote or facilitate the heat transfer from the heat source to the fins by the use of a heat pipe inserted into an axial opening in the core shaft that supports the fins. Still another problem overcome by the improved stackable heat sink is to form the base with an opening in which the core shaft is press fit and/or including a portion on which a small cooling fan may be mounted so as to move air directly between adjacent fins and in a general direction of the fin corrugation, where the fins are so formed.

Yet another object of the present invention is to provide a heat sink that is of low cost, simple construction, made from common materials, and constructed using machine tools in common use.

SUMMARY OF THE INVENTION

The present invention comprises a heat sink for use with electronic components that includes a base of heat-conducting material for engaging a surface of the electronic component from which the heat is to be dissipated, a core shaft secured in the base, and a plurality of heat-dissipating fins mounted on the shaft forming a plurality of parallel air passages. More particularly, in the improved invention, the plurality of heat-dissipating fins may be formed with corrugations so as to increase the area of the fin without increasing its perimeter. An additional improvement is the use of a heat sink in conjunction with the base and/or core shaft of the invention so as to rapidly transfer heat from the portion of the base and/or shaft in heat-conducting contact with the electronic component (heat source) to other portions of the core shaft and/or base so as to more rapidly dissipate the heat. Still another improved aspect of the invention is to provide, integral with the base, a support for a small cooling fan which may be positioned so as to effectively move air to the passages between adjacent fins.

BRIEF DESCRIPTION OF THE DRAWINGS OF THE INVENTION

One embodiment of a heat sink constructed in accordance with the present invention in shown in perspective view in FIG. 1;

FIG. 19 is an alternate embodiment of the use of a heat pipe in the base of the improved stackable heat sink;

FIG. 20 is an exploded view of an improved stackable heat sink including a base on which may be mounted a fan;

FIG. 21 is a side elevation view of the improved stackable heat sink of FIG. 20; and FIG. 22 is a perspective exploded view of the improved stackable heat sink of FIG. 20.

DETAILED DESCRIPTION OF SELECTED EMBODIMENTS OF THE INVENTION

A first embodiment of the present invention is shown completely assembled in FIGS. 1 through 4. The invention comprises base 10, shaft 30, and plurality of fins 50 that comprise a stackable heat sink for electronic components. Base 10 may comprise plate 12 of heat-dissipating material, such as metal. Other types of material with good heat-conducting capability are also suitable for use in the invention. The particular configuration of base 10 is adapted to the electronic component and component mounting assembly and may be of any size or shape. The specific mounting plate 12 shown is for use in connection with the Intel S.E.C. cartridge. However, the present invention can be configured for use with many different cartridges and processors. Base 10 provides the means for securing the heat sink to the cartridge thermal plate as will be described below. The base or plate 12 has an opening for receiving shaft 30. Plate 12 may be attached to a cartridge containing the semiconductor device through plastic pins.

Figure 1:
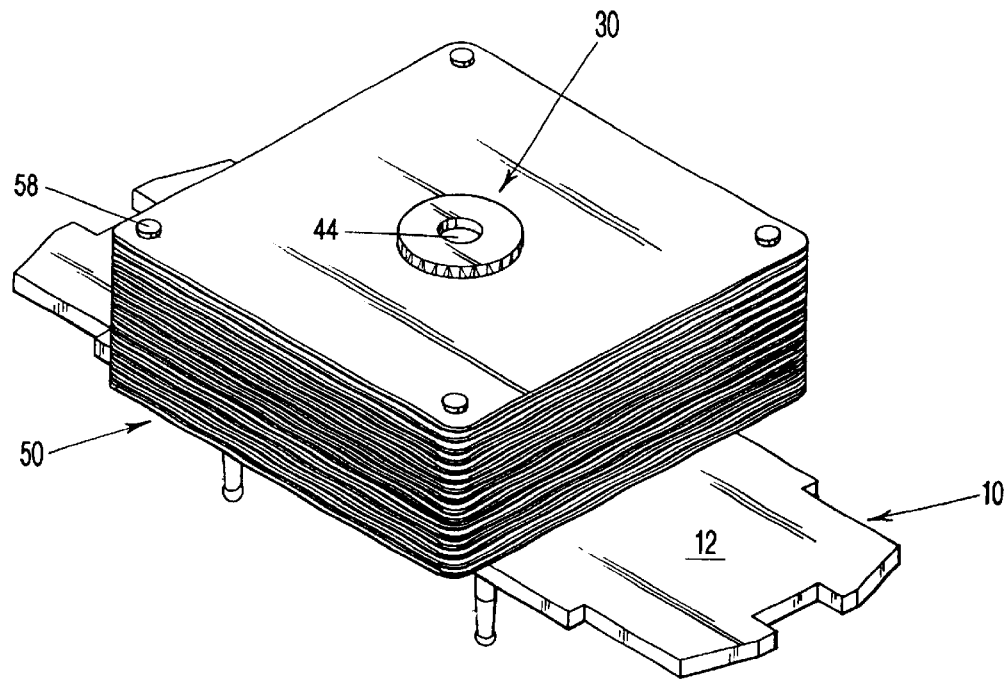
Figure 2:
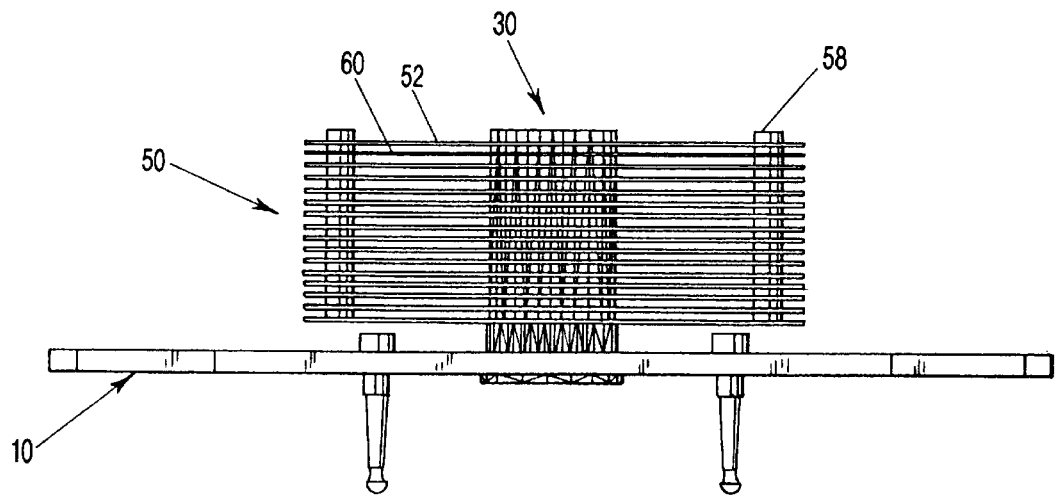
FIG. 2 is a side elevation view of the embodiment shown in FIG. 1.
Figure 3:
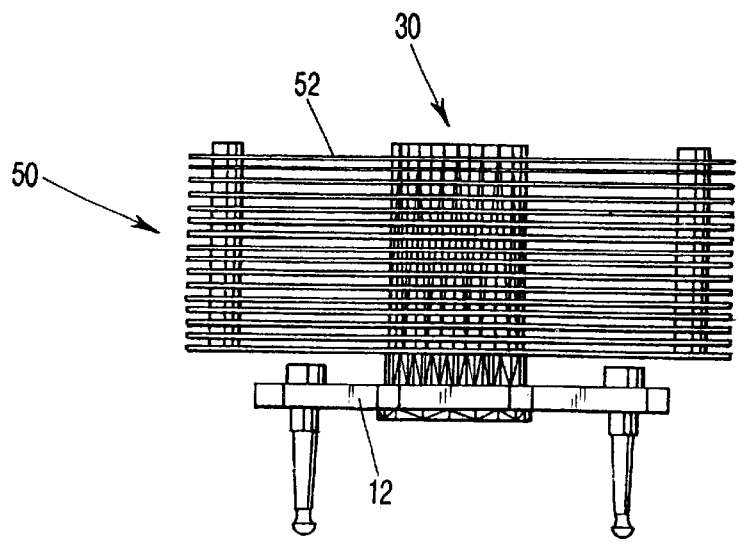
FIG. 3 is an end elevation view of the embodiment of the heat sink shown in FIG. 1.
Figure 4:
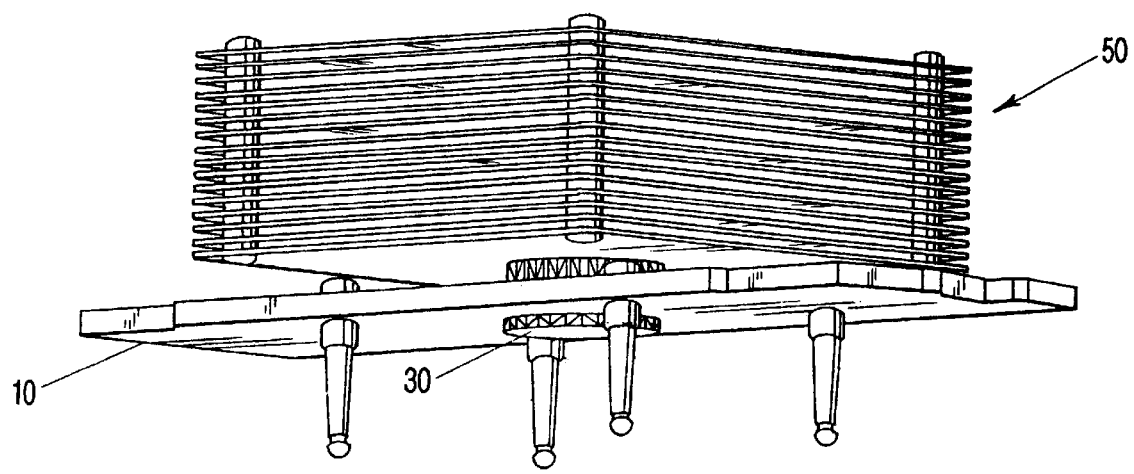
FIG. 4 is another perspective view of the embodiment of the heat sink shown in FIG. 1, showing the lower portion of the heat sink.
Figure 5:
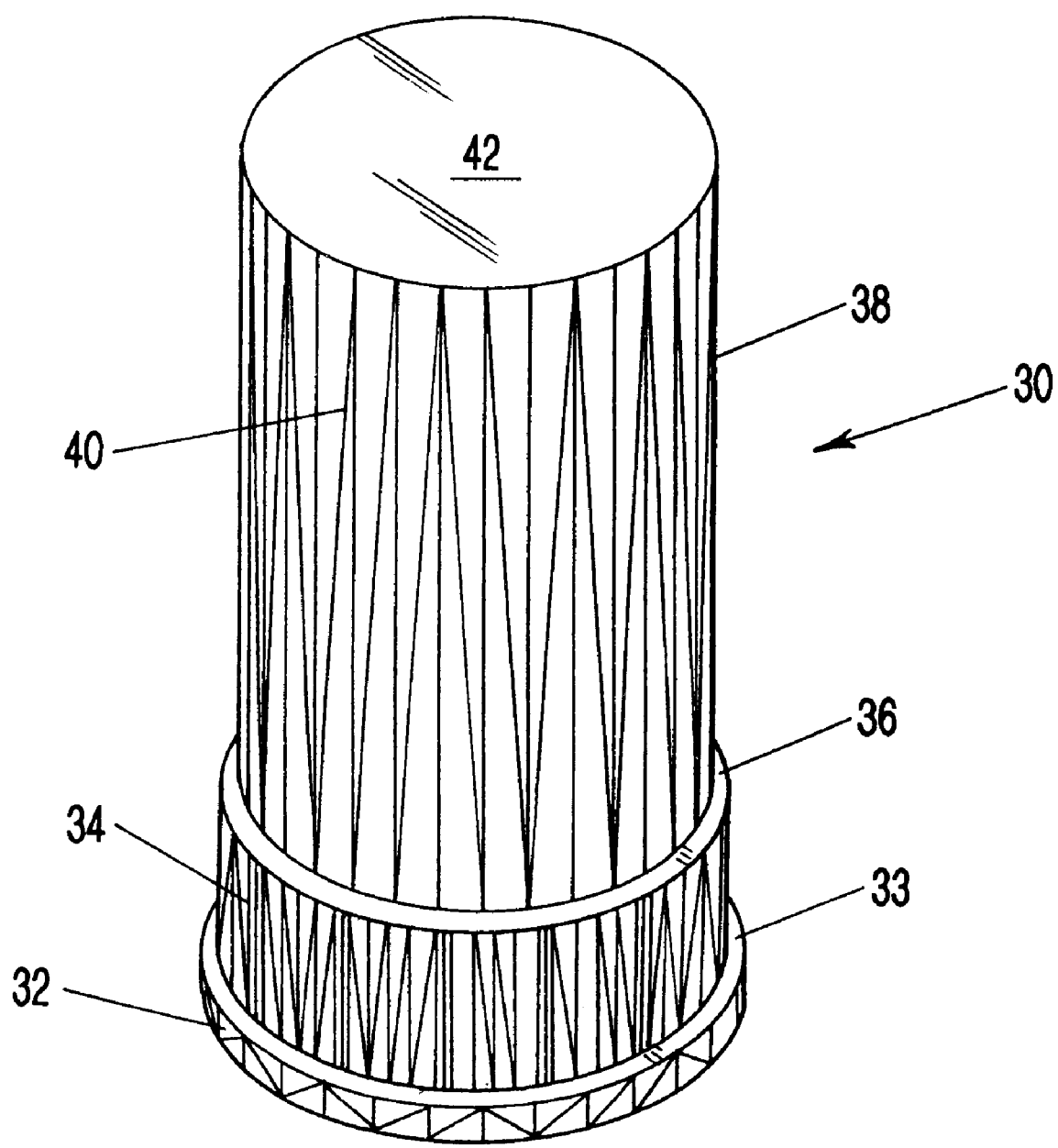
FIG. 5 is a detailed view of the shaft of the heat sink embodiment shown in FIG. 1.

Shaft 30 is shown in detail in FIG. 5. In the embodiments disclosed, shaft 30 is generally cylindrical in shape, although it should be understood that the shaft cross-section could be square, rectangular, elliptical or other cross-section as may be selected for the particular manufacturing process and the intended use of the heat sink. Shaft 30 has three sections. The lowermost section comprises annular lip 32 which as seen best in FIGS. 2 and 4, provides a stop or shoulder 33 for limiting the insertion of shaft 30 into base plate 12. A second section 34 has a slightly smaller diameter than annular lip 32. The diameter of section 34 is only slightly less than the diameter of the opening in the base plate 12. When shaft 30 is assembled with base plate 12, the section 34 of the shaft is press fit into the opening of the base. The height of the section 34 is greater than the thickness of base plate 12 and forms a shoulder at its upper end indicated at 36. As seen best in FIG. 2, the shoulder 36 functions as a stop for the lowermost fin of the fin assembly 50. The third section of shaft 30 is of yet smaller diameter, as shown at 38, and extends from shoulder 36 to the upper end of shaft 30. As seen best in FIG. 1, when all of the fins, as will be described below, are assembled onto shaft 30, the upper end may be coined so as to increase the diameter of the top edge of the shaft section 38, thereby preventing the uppermost fin from disengaging with the shaft.

Figure 6:
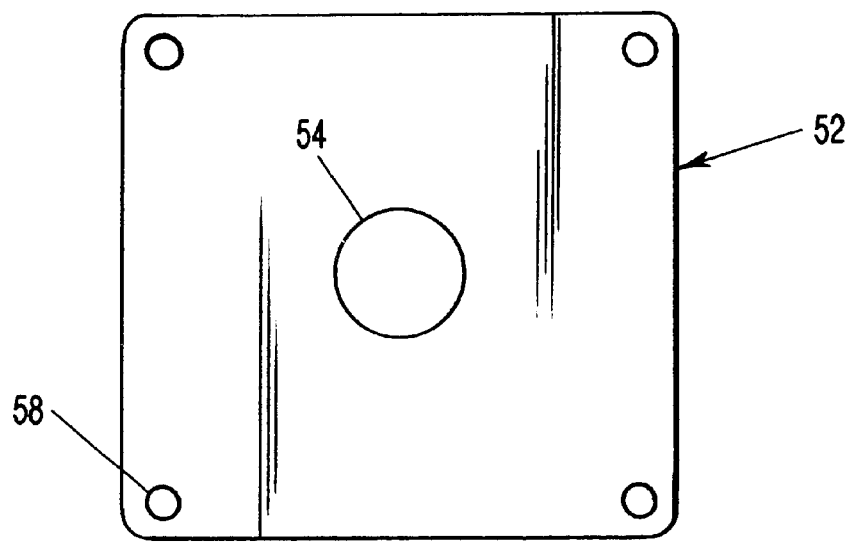
FIG. 6 is a detailed view of one of the typical fins included in the first embodiment of the heat sink shown in FIG. 1.
Figure 7:
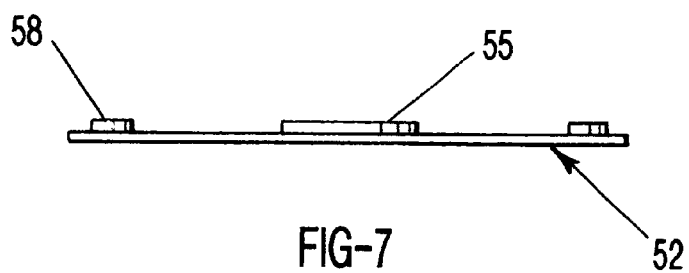
FIG. 7 is an end elevation view of the fin shown in FIG. 6.

Fin assembly 50 comprises a plurality of individual fins 52, one of which is shown in FIGS. 6 and 7. Fin 52 is shown in the embodiments disclosed as having a square or rectangular shape, although it will be appreciated that the shape of the fin could be round, oval, or some other geometric shape. Each fin is formed from a suitable heat-conducting material, such as metal, more specifically, aluminum. In the embodiment shown in FIG. 1, the fin's material stock is 0.015 inches and is made from 1100-H18 Aluminum. Fin 52 has an opening 54 which is shown located centrally in the fin, although it will be understood that the opening need not be centered within the geometric shape although that may be preferable for maximizing the heat conduction from the core shaft to all portions of the fin.

Figure 7A:
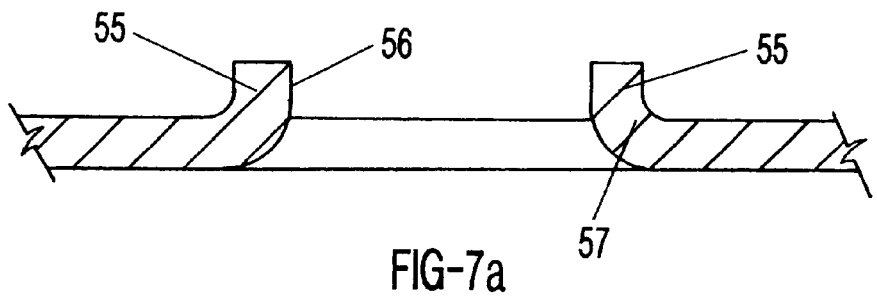
Figure 8:
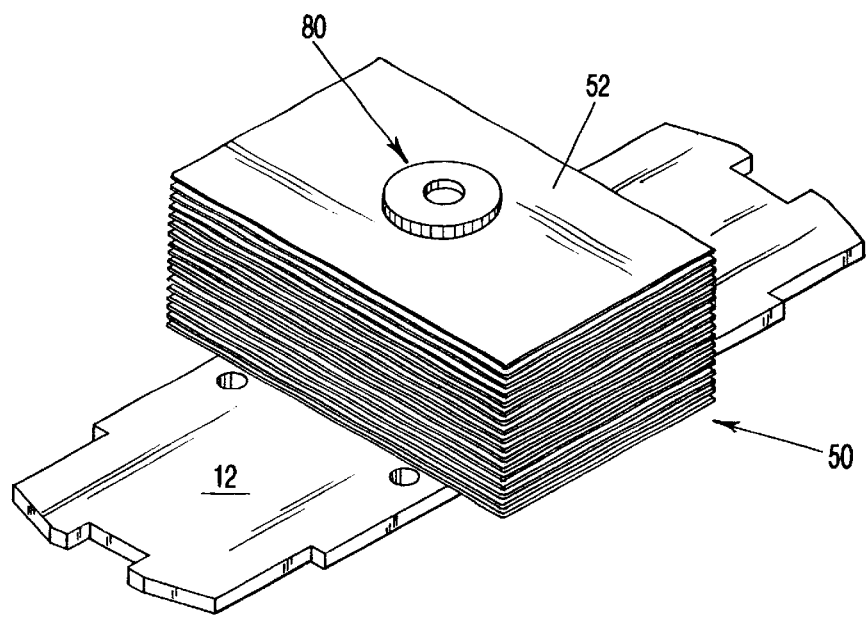
FIG. 8 is a perspective view of a second embodiment of the heat sink in accordance with the present invention.
Figure 9:
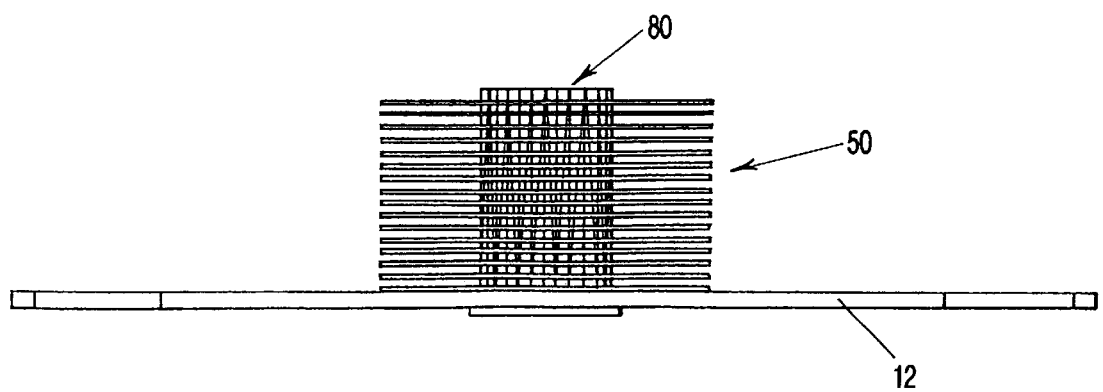
FIG. 9 is a side elevation view of the heat sink shown in FIG. 8.
Figure 10:
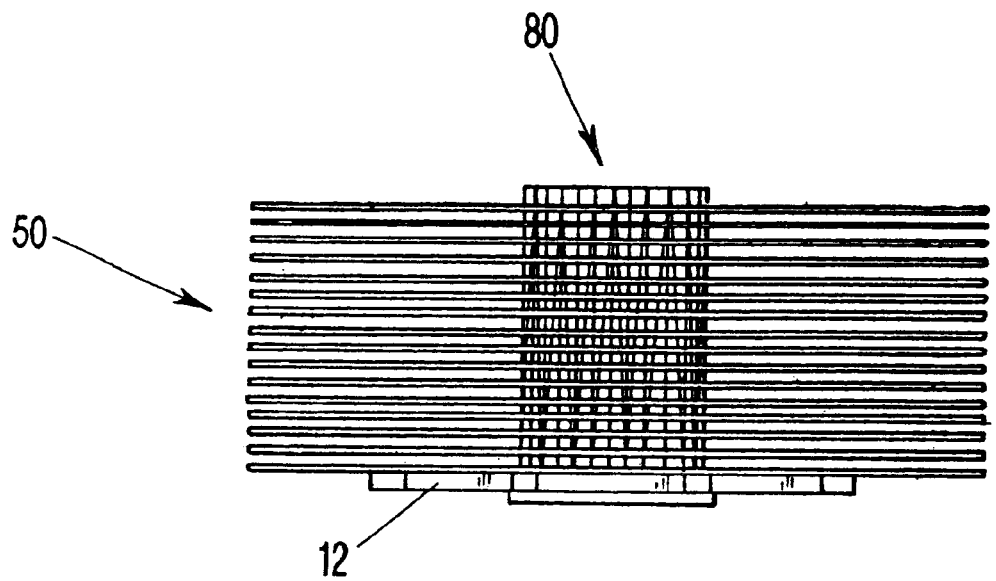
FIG. 10 is an end elevation view of the embodiment shown in FIG. 8.
Figure 11:
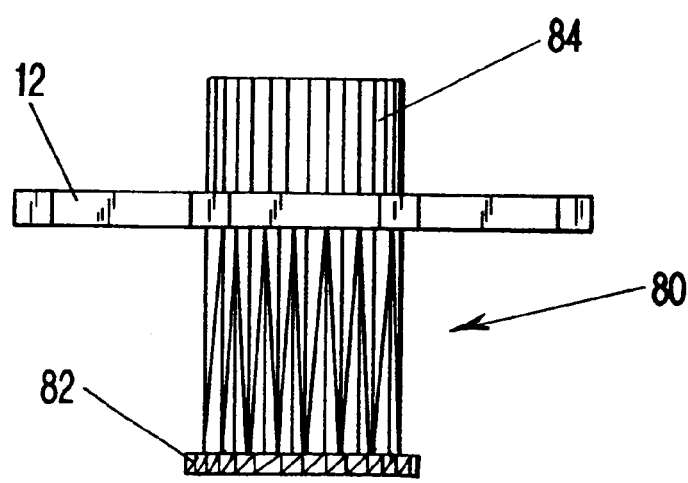
FIG. 11 is a detailed view of the shaft of a heat sink embodiment shown in FIG. 8.
Figure 12:
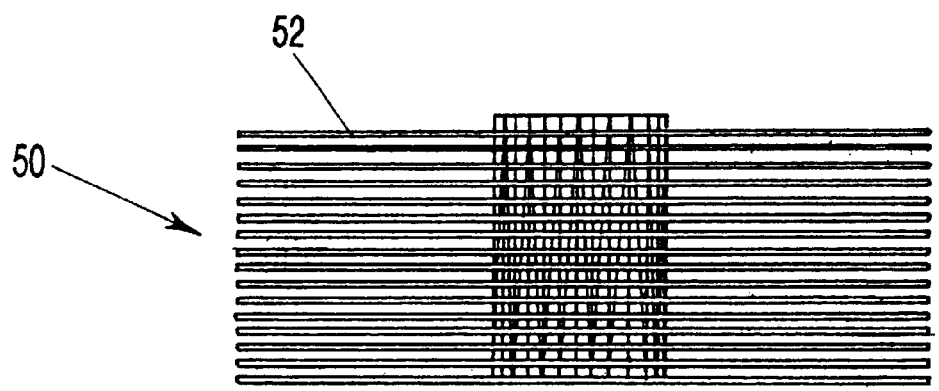
FIG. 12 is an assembly of fins for use in the second embodiment of the heat sink shown in FIG. 8.

Opening 54 is initially machined, such as by stamping, with a dimension that is less than the dimension of the third section 38 of shaft 30. The hole is then coined or swaged so as to create a flange shown at 55 in FIG. 7a. In the process of deforming the materials so as to create the flange 55, the surface area, indicated at 56, will be greater than the surface area of the opening before coining. Thus, by coining the opening 54, and producing flange 55, the heat transfer area between the fin and the shaft section 38 will be increased, thus more effectively transferring heat from the core shaft to each individual fin. Furthermore, creation of the flange and increase of the engaging surface area between the fin and shaft will produce greater structural stability. Additionally, because the process of coining or swaging will create a radius in the material, as shown at 57, the opening on the bottom of the fin is slightly larger than the opening at the top of the fin, resulting in a funnel-shaped opening that facilitates positioning of the fin on the core shaft and forcing the fin down onto the shaft, as explained more fully below.

Each fin also includes at least several separators, indicated at 58, four of which are shown in this particular embodiment. As seen best in FIG. 7, the separators project above the surface of the fin and, as seen best in FIG. 2, will contact the adjacent fin, thereby preventing the fins from being inadvertently bent, or if a fin is not flat when originally manufactured, or any other condition that may result in restricting the air flow through passage 60 between adjacent fins. A separator may have a variety of configurations. A separator could be a separate element that is attached to the fin by adhesive, soldering, or other means. If the separator is a separate element from the fin, it is preferably made of the same material. However, the preferable manner of forming the separators is to coin the material of the fin so as to create a dimple, protrusion, or other raised area. Such construction is extremely inexpensive and is extremely simple, as is desirable for purposes of cost, resisting detachment in the event of vibration or shock, or similar reasons. In the particular embodiment shown in FIGS. 1 through 7, if the fin has a material stock of 0.015 inches as indicated above, the height of the fin from the lower surface of the fin to the upper surface of the dimple would be 0.065 plus or minus 0.005 inches. It is desirable that the dimple have a height which is at least twice that of the thickness of the fin so as to assure continued maintenance of an air passageway between adjacent fins.

The outer surface of the core shaft is roughened so as to resist movement of the fins after assembly on the shaft. Such roughening may be in the nature of physically scoring the outer surface of the portions of the shaft, or more particularly by knurling the outer surface. Such knurling is shown at 40 on FIG. 5. It will be noted that both the upper or top or third section 38 is knurled, as well as the center or second portion 34. The shaft is constructed of a high heat transfer material, such as copper, to rapidly move the heat from the portion of the shaft closest to the heat source to the fins that are spaced apart on the shaft.

The stackable heat sink shown in the first embodiment may be built at the appropriate time to accommodate the heat generated in the component to which the heat sink is attached. Typically, the thermal engineer will determine the total heat dissipation surface area required for the application and thus specify for manufacturing personnel the number of fins that must be assembled onto the core shaft. The manufacturing operation can then pre-build heat sinks as required for production needs by assembling the complete heat sink. Such assembly involves insertion of the smallest diameter end of the core shaft into the opening in the base and forcing the entire shaft through the opening until annular lip 32 contacts the bottom surface of base plate 12. This press fit will normally keep the two parts in sufficient engagement during use of the heat sink. However, it would also be possible to secure the shaft to the base by other means, including adhesive, or mechanically by clips, threading the opening and second section of the shaft, or the like. Lip 32 also prevents shaft 30 from being forced upwardly out of the opening in plate 12 when the assembly is subject to vibration or shock in the plane perpendicular to the plane of plate 12. The method or means for attaching the shaft to base plate 12 does not form a critical part of the present invention. Once shaft 30 and base 10 are assembled, then the specified number of fins may be assembled by aligning the opening 54 in each fin over the upper end of the shaft 30 and manually forcing the fin onto the shaft individually, or in a gang. Obviously, various types of automatic or semi-automatic tools could be used for forcing the fins onto the shaft where the number of heat sinks being constructed would warrant the expense of such non-manual assembling device. Finally, to secure all of the fins onto the shaft, the upper surface of the shaft, 42, may be coined, as shown at 44 in FIG. 1, resulting in a slight increase in the diameter of the shaft due to deformation of the material which will prevent the fin from working loose on the shaft such as may otherwise occur if the heat sink is being used in electronic equipment subjected to vibration or shock.

It will be appreciated that one of the advantages of the stackable heat sink is that should it be found in the manufacture of the equipment that thermal conditions were higher than originally designed for, or that a design computation failed to include all of the sources of heat generation, or for various other reasons, that the total heat-dissipating surface area of the heat sink may be easily changed by simply adding another fin. Moreover, it will also be appreciated that the base plate and core shaft provide the foundation for building heat sinks of various capacity. For example, if heat sinks are required of different dissipating capacity within the same piece of equipment, it would be unnecessary to inventory different physical heat sinks. Working with the foundation, and the specified number of fins required for the particular component, a single basic heat sink could be adapted for various types of components with different amounts of generated heat.

Referring now to FIGS. 8 through 12, a second embodiment of a heat sink constructed in accordance with the present invention is shown. In this heat sink, as shown best in FIG. 9, fins 52 have a rectangular configuration wherein the long ends of the fin project beyond the edges of the base plate 12. Furthermore, as seen best in FIG. 11, core shaft 80 has two sections, including the annular ring 82 and roughened surface 84 of the second section of the shaft, which is of less diameter than portion 82. In this embodiment, there are no separators to maintain the air passageways between adjacent fins. Moreover, the fins are pre-assembled and are inserted onto the section 84 of shaft 80 as a pre-assembled unit. The pre-assembly may attach individual fins to one another through various means such as an epoxy or the like. Furthermore, without the middle section 34, as shown in FIG. 5, the lowermost fin may be inserted all the way down the shaft until it contacts the upper surface of base plate 12. As in the first embodiment, the upper surface of shaft 80 may be coined so as to retain all of the fins on the shaft during use of the heat sink.

Figure 13:
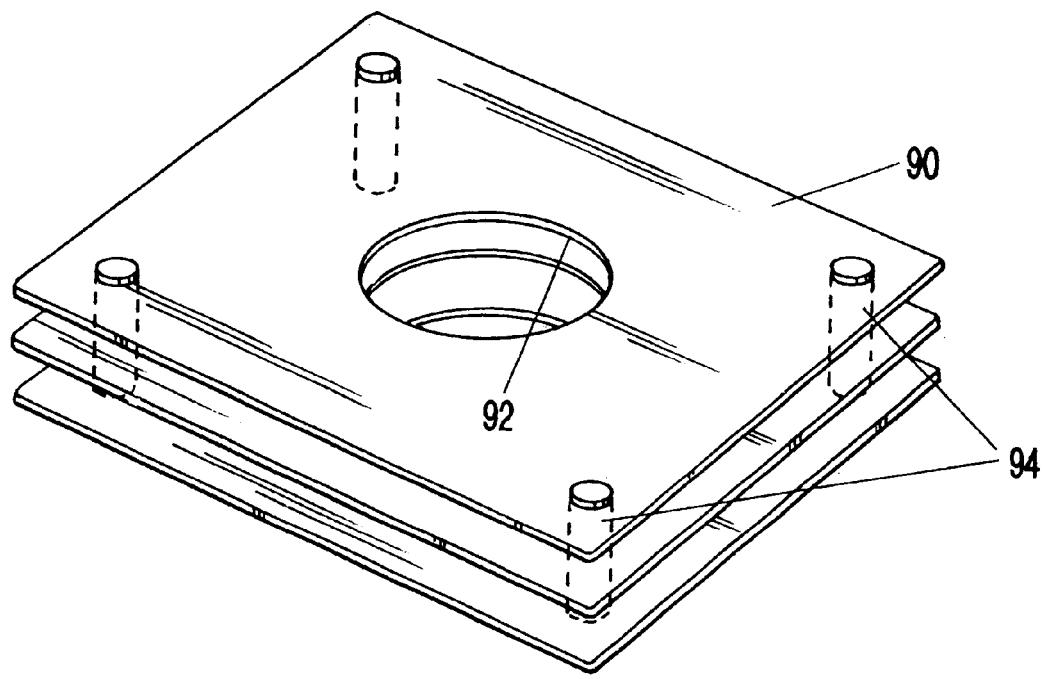
FIG. 13 is a third embodiment of a heat sink constructed in accordance with the present invention.

As shown in FIG. 13, there are alternative configurations if it is desired to pre-assemble the fins prior to insertion onto the shaft. In the embodiment shown in FIG. 13, fins 90 have a central opening 92 for accommodating a shaft, such as shaft 30. The individual fins are held in place with at least several pins such as shown at 94 which are inserted through suitable holes made in the peripheral portions of each fin, thereby performing the dual function of creating a sub-assembly unit while simultaneously spacing the fins from one another so as to assure the maintenance of air passageway between adjacent fins.

The invention also contemplates the further extension of the heat capacity of a stackable heat sink by the provision of a second shaft similar in configuration to core shaft 30 or 80, but having a cylindrical opening or inset in the bottom of the shaft with a diameter approximately equal to the diameter of the upper end of a first shaft. When it is desired to increase the height of the stack, this second shaft may be press fit onto the top of the first shaft, thus effectively elongating the shaft and permitting the addition of other fins. In addition to securing the second shaft to the first by a press fit, other types of adhesive or mechanical fastenings may be used to secure the two shafts together.

Figure 14:
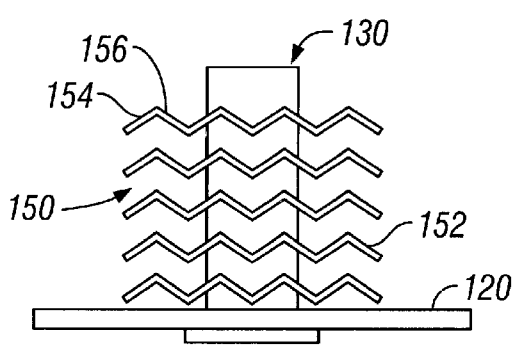
FIG. 14 is a side elevation view of an improved stackable heat sink.
Figure 15:
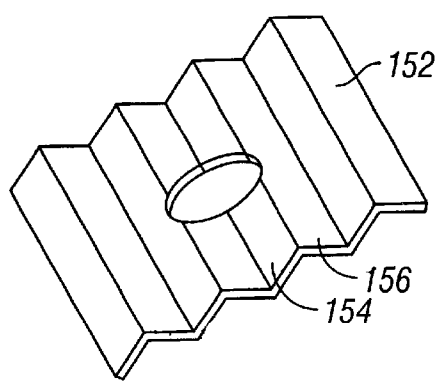
FIG. 15 is a perspective view of one of the corrugated fins of the improved stackable heat sink of FIG. 14.
Figure 16:
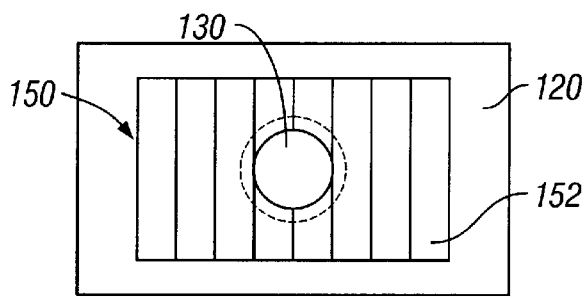
FIG. 16 is a top view of FIG. 14.

In FIGS. 14 through 16, there is shown an improved stackable heat sink in which the area of the heat sink may be increased without increasing the area encompassed by the heat sink in the plane of the printed circuit board to which the electronic component, that is, the heat source, for which the heat sink functions.

In FIG. 14, a simple baseplate 120 is shown having an opening for core shaft 130 which may be identical to core shaft 30 in the embodiment shown in FIGS. 1 through 4. Fin assembly 150 comprises a plurality of individual fins 152 one of which is shown best in FIG. 15. In the embodiment disclosed fin 152 may have a square or rectangular shape although it will be appreciated that the shape of the fin could be round, oval, or some other geometric shape. In order to increase the area, fins 152 are formed with corrugations so that the total surface area, as measured if the fin was flattened, would be greater than the area of a flat fin having the same perimeter as the corrugated fin. While the corrugations as shown in FIGS. 14 and 15 have relatively sharp angles, it should be understood that any type of surface forming could be utilized so as to increase the area of fin 152 without increasing its outer perimeter. In an embodiment in which the fins have corrugation, the angle included between adjacent flat sections 154, 156 of the fin could be acute or obtuse. The surface forming of course could be performed in a variety of ways such as the formation of raised areas by creating a plurality of circular indentations, or craters, or pyramidal shaped indentations, so long as the indentations are in registry when multiple fins are mounted on a shaft in relatively close spacing. One advantage of a straight corrugation is the manufacturing process is simple and in use the troughs between the corrugations form air passages which may be aligned with the airflow within the enclosure in which the electronics assembly is being used which will facilitate the movement of air. Conversely, the troughs would require the fins to be aligned with the direction of airflow from, for example, a cooling fan, thus requiring a particular orientation of the heat sink.

Figure 17:
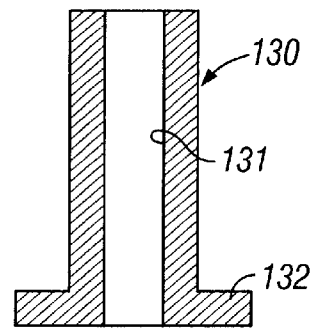
FIG. 17 is a cross sectional view of a core shaft and heat pipe.
Figure 18:
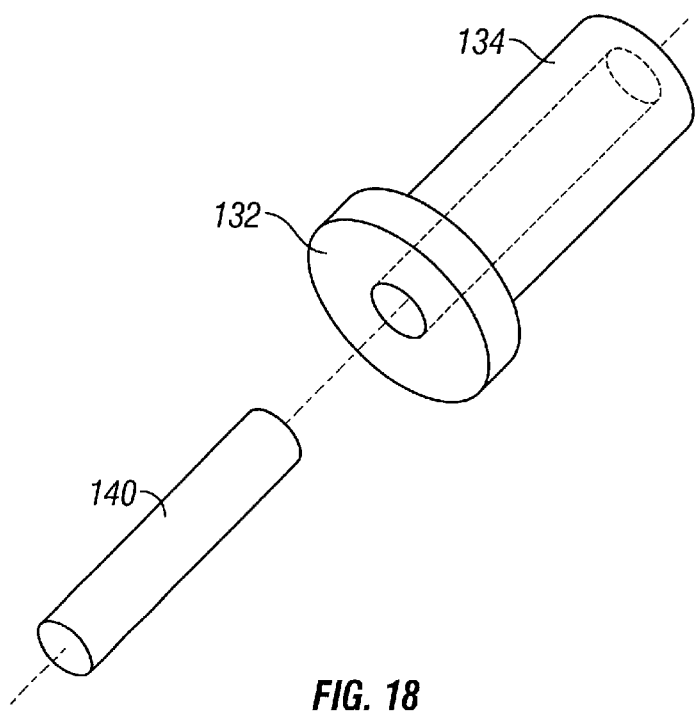
FIG. 18 is an exploded view of the heat pipe and core shaft.

In another embodiment of an improved stackable heat sink, core shaft 130 may be formed with a cylindrical opening 131 as shown in FIGS. 17 and 18. In all other respects the core shaft is identical to that shown in FIG. 14 and in FIGS. 1 through 4. FIGS. 17 and 18 overcome the problem of slow heat transfer from the portion of core shaft 132 which is in heat conducting relationship with the electronic component that is the heat source, toward the free end of core shaft 134. To facilitate heat transfer along the length of the shaft, and thus to transfer the heat as rapidly as possible to the plurality of fins, the improved stackable heat sink includes heat pipe 140. A heat sink suitable for use in the invention is that manufactured and sold by Noren Products, Inc., 1010 O'Brien Drive, Menlo Park, Calif. 94025. The heat pipes manufactured by this company may be fabricated from metal, such as aluminum or copper, and contain a liquid and function so as to move heat from the input to the heat pipe, which in this case is in a cylindrical configuration, to the output of the heat pipe. Heat pipes have an effective thermal conductivity that is thousands of time greater than copper. In this manner, the heat sink will rapidly move heat from the heat source toward free end 134 of the core shaft thus distributing the heat rapidly to the fins such as fins 152. It should be understood that the improvement shown in FIGS. 17 and 18 may be used with any of the embodiments of the invention.

In FIG. 19 another heat pipe application is shown where base 120 is provided with elongated slotted opening 122 into which rectangular heat pipe 142 is press fit.

In FIG. 20 there is shown another embodiment of an improved heat sink comprising core shaft 230 having enlarged diameter portion 232 in heat-conducting relationship with the electronic component. A plurality of fins 250 are shown mounted on core shaft 230 as in previous embodiments described. In this embodiment, base 220 is formed with flat horizontal section 222 and integral vertical portion 223. Vertical portion 223 is in relatively close space relationship from the adjacent edges of fins 250. As seen best in FIG. 21, the vertical portion 223 of base 220 has a plurality of openings shown at 224 which in this particular embodiment are oriented in a vertical direction. The openings 224 may be formed by stamping louvers, shown at 225, for directing airflow. The louvers may also be stamped so as to vary the size of each air passage or opening 224. As seen best in FIG. 22, there is provided a small cooling fan indicated generally at 260 of standard configuration in the industry. Cooling fan 260 has air inlet 262 and the conventional blade assembly (not shown) which will direct air through openings 224 in portion 223 of base 220. When the cooling fan 260 is mounted to portion 223 of base 220, the air will be directed to passages 252 between adjacent fins 250. Thus the improved heat sink shown in FIGS. 20 through 22, in addition to comprising the inactive means for dissipating heat, also includes the active electronic component, cooling fan 260, which will further increase the heat-dissipating capacity of the improved heat sink.

It will therefore be seen that the several embodiments of the stackable heat sink invention accomplish the objectives as set forth above and provide a superior heat sink for electronic components. While various embodiments have been shown, it should also be obvious to those having ordinary skill in the art that there are still further variations in the materials, configurations, methods of attachment, and other features of the invention which while not disclosed, are encompassed within the spirit of the invention.

What is claimed is:

1. A stackable heat sink for electronic components comprising:
    a base with at least one opening;
    at least one core shaft, said core shaft secured in one of said base openings, said core shaft defining an opening;
    at least one self-contained heat pipe corresponding to said at least one core shaft, said self-contained heat pipe located within said opening defined by said core shaft; and
    a plurality of separate thin heat dissipating fins individually detachably mounted on said shaft for varying the heat dissipating surface area of the heat sink, and to form a plurality of parallel air passages between adjacent fins, each of said fins defining an opening for said shaft to extend through upon mounting said fin onto said shaft, said opening further comprising a flange in heat transfer engagement with said shaft and for providing a spaced relationship between each fin.

2. The heat sink of claim 1 wherein the end of the core shaft secured in the base is in heat conducting contact with an electronic component and said self-contained heat pipe permits heat transfer from the portion of the core shaft in contact with the electronic component toward the free end thereof.

3. The heat sink of claim 2 wherein the self-contained heat pipe comprises a sealed metallic container containing a liquid.

4. The heat sink of claim 3 wherein said self-contained heat pipe has an effective thermal conductivity that is at least as great as that of a metal selected from the group consisting of copper and aluminum.

5. The heat sink of claim 1 wherein said self-contained heat pipe comprises a cylindrical self-contained heat pipe having high thermal conductivity and arranged perpendicular to the plane of said base and wherein said self-contained heat pipe is in heat conducting contact with an electronic component such that said self-contained heat pipe transfers heat away from the electronic component.

6. The heat sink of claim 1 wherein said fins are arranged circumferentially around said core shaft and along the length of said core shaft in a spaced parallel relationship to each other and to the plane of said base.

7. The heat sink of claim 6 wherein said core shaft is centrally located within said plurality of heat dissipating fins and in heat conducting contact with an electronic component to cause heat transfer away from the electronic component.

8. The heat sink of claim 1 wherein said self-contained heat pipe is fabricated from a metal selected from the group consisting of aluminum and copper.

9. The heat sink of claim 1 wherein said self-contained heat pipe comprises a cylindrical self-contained heat pipe in heat conducting contact with an electronic component and wherein said self-contained heat pipe contains a heat transfer material in contact with at least one interior surface of said self-contained heat pipe to improve thermal conductivity and increase the speed of heat transfer away from the electronic component.

10. The heat sink of claim 2 wherein said self-contained heat pipe comprises a cylindrical self-contained heat pipe having high thermal conductivity and closed at each end by respective circular planar surfaces, wherein one of said planar surfaces of said self-contained heat pipe is in heat conducting contact with said base and the electronic component.

* * * * *